United States Patent
Sugiyama et al.

(10) Patent No.: US 10,050,014 B2
(45) Date of Patent: Aug. 14, 2018

(54) CIRCUIT SUBSTRATE AND METHOD OF MANUFACTURING SAME

(71) Applicant: TAIYO YUDEN CO., LTD., Tokyo (JP)

(72) Inventors: Yuichi Sugiyama, Tokyo (JP); Masashi Miyazaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/436,449

(22) Filed: Feb. 17, 2017

(65) Prior Publication Data

US 2017/0243854 A1    Aug. 24, 2017

(30) Foreign Application Priority Data

Feb. 22, 2016 (JP) .................................. 2016-030606
Feb. 14, 2017 (JP) .................................. 2017-025046

(51) Int. Cl.
*H01L 25/065* (2006.01)
*H01L 23/492* (2006.01)
*H01L 23/498* (2006.01)
*H01L 21/48* (2006.01)

(52) U.S. Cl.
CPC ........ *H01L 25/065* (2013.01); *H01L 21/4853* (2013.01); *H01L 21/4871* (2013.01); *H01L 23/492* (2013.01); *H01L 23/49894* (2013.01); H01L 2225/06527 (2013.01)

(58) Field of Classification Search
None
See application file for complete search history.

(56) References Cited

U.S. PATENT DOCUMENTS 5,371,404 A * 12/1994 Juskey .................... H01L 23/04
                                                          257/659
2006/0198106 A1 * 9/2006 You .................... G02F 1/133305
                                                          361/702

FOREIGN PATENT DOCUMENTS

JP           2011-108929 A     6/2011

* cited by examiner

*Primary Examiner* — Eva Y Montalvo
*Assistant Examiner* — Kevin Quinto
(74) *Attorney, Agent, or Firm* — Chen Yoshimura LLP

(57) ABSTRACT

A circuit substrate of one aspect of the present invention includes a first substrate body made of a flexible wiring substrate and having a first edge and a second edge opposite to the first edge, the first substrate body having a bottomed or bottomless recess adjacent to the first edge; a plate-shaped or frame-shaped reinforcement member disposed in the recess of the first substrate body adjacent to the first edge; a pair of resin layers sandwiching the reinforcement member in the recess and a portion of the first substrate body adjacent to the reinforcement member including the first edge, each of the resin layers having a circuit portion formed thereon electrically connected to the flexible wiring substrate.

12 Claims, 6 Drawing Sheets

CIRCUIT SUBSTRATE AND METHOD OF MANUFACTURING SAME

BACKGROUND OF THE INVENTION

Technical Field

The present invention relates to circuit substrate including a flexible portion and a rigid portion, and a method of manufacturing the circuit substrate.

Background Art

The functions demanded in electronics have become diversified following the expansion of the information technology industry, with the demand for accelerated starts to development and production also increasing. In smartphones, in particular, a wide variety of functions have been added to the basic telephone function, such as internet, electronic mail, camera, GPS, wireless LAN, 1seg television, etc., and the number of smartphone models is also growing. In sophisticated smartphones, improving battery capacity has been a problem, and progress is being made in higher density mounting on the mainboard, miniaturization and thinning of the device, and modularization of functional blocks. There is particularly a demand for the thinning of the modules installed in the smartphone to include a bonding method with the mainboard.

Further thinning is demanded for the module substrate used in mobile devices such as smartphones in order for the components to have more functions and to make the device thinner. In particular, when a flexible substrate or the like is used to connect the main substrate and modules, it is already known how to use connectors and bond the module substrate and flexible substrate to each other, but there are problems with a decrease in mounting area, an increase in thickness of the entire module, and the like. This is the reason that the adoption of composite circuit substrates (rigid-flexible substrates) that have a rigid portion on the flexible substrate has seen progress.

Patent Document 1, for example, discloses a circuit substrate including a deformable flexible portion, a rigid portion to which the flexible portion connects and which includes an insulating base material and an electric circuit formed on the insulating base material, and a reinforcement member that is formed in the periphery of the insulating base material and that applies internal stress to the insulating base material, the reinforcement member being made of an insulating resin having a higher rigidity than the insulating base material.

RELATED ART DOCUMENT

Patent Document

Patent Document 1: Japanese Patent Application Laid-Open Publication No. 2011-108929

SUMMARY OF THE INVENTION

In fields where further device thinning has been demanded recently, such as in camera modules, there are requirements to develop circuit substrates with strong rigid portions while satisfying thickness requirements. However, in configurations where reinforced portions are provided in the periphery of the rigid portion, the surface center section of the rigid portion is weaker than at the periphery, which causes susceptibility to warping and deformation.

In consideration of the situation described above, an aim of the present invention is to provide a circuit substrate that can improve the strength of the rigid portion while satisfying thickness requirements, and a method of manufacturing this circuit substrate. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a circuit substrate, including: a first substrate body made of a flexible wiring substrate and having a first edge and a second edge opposite to the first edge, the first substrate body having a bottomed or bottomless recess adjacent to the first edge; a plate-shaped or frame-shaped reinforcement member disposed in the recess of the first substrate body adjacent to the first edge; a pair of resin layers sandwiching the reinforcement member in the recess and a portion of the first substrate body adjacent to the reinforcement member including the first edge, each of the resin layers having a circuit portion formed thereon electrically connected to the flexible wiring substrate.

In the circuit substrate described above, due to the plate-shaped or frame-shaped reinforcement member embedded in the recess of the first substrate body, the strength of the structure including and surrounding the reinforcement member is improved while satisfying the thickness requirements of the substrate.

The form or planar shape of the first substrate body and the reinforcement member has no particular limitations; for example, the planar shape of the first substrate body may surround the recess and may be shaped generally rectangular, and the reinforcement member may be made of a rectangular plate, and may have a vertical trench or cavity therein.

The recess of the first substrate body may include an electronic component embedded therein sandwiched by the pair of resin layers.

The circuit substrate described above may further include a first insulating material filled into the vertical trench or cavity of the reinforcement member, and the first insulating material may have a lower thermal expansion coefficient and higher elasticity than a resin material forming the resin layers.

The circuit substrate described above may further include a second insulating material inside the recess between the reinforcement member and a sidewall of the recess at least on a side opposite to the first edge, and the second insulating material may be made of a material having a lower elasticity than the resin material forming the resin layers.

Further, the first insulating material and the second insulating material may be both disposed relatively on the side opposite to the first edge in the recess of the first substrate body.

The circuit substrate described above may further include an insulating layer on at least one surface of the reinforcement member, and a wiring layer on the insulating layer, the wiring layer being electrically connected to the electronic component and the circuit portion. An electronic component may or may not be provided in the recess of the first substrate body. When the electronic component is provided in the recess, the wiring layer on the insulating layer may be connected to the electronic component.

The circuit substrate described above may further include a control substrate physically and electrically connected to the second edge of the flexible wiring substrate.

In another aspect, the present invention provides a method of manufacturing a circuit substrate, including: forming a recess adjacent to one edge of a flexible wiring substrate; placing a plate-shaped or frame-shaped reinforcement member made of metal in the recess; and forming a circuit portion that electrically connects to the flexible wiring substrate on the one edge.

As described above, the present invention makes it possible to improve the strength of the rigid portion while satisfying thickness requirements. It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described below with reference to the drawings.

Embodiment 1

Figure 1:
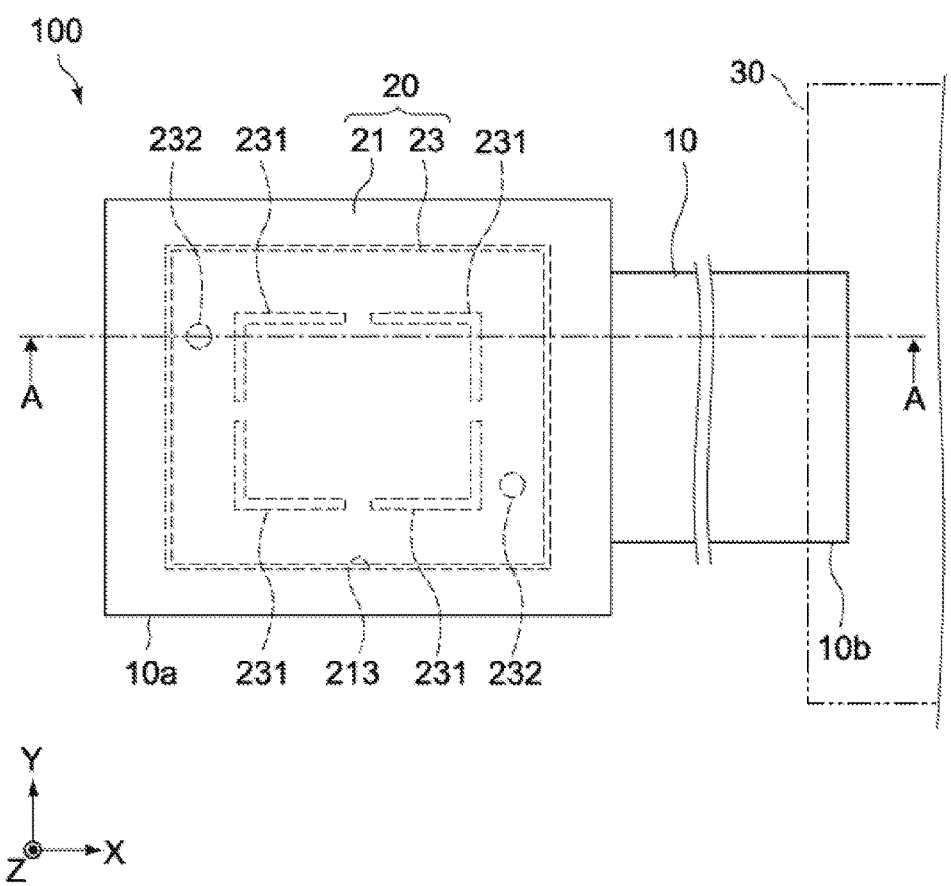
FIG. 1 is a schematic cross sectional view of the configuration of a circuit substrate according to one embodiment of the present invention.
Figure 2:
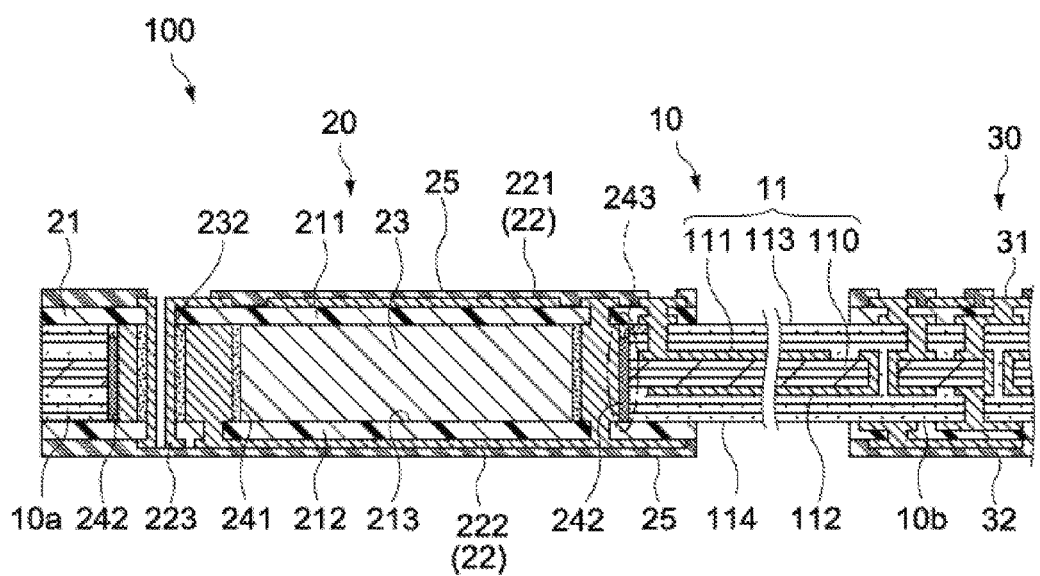
FIG. 2 is a cross-sectional view along the A-A line direction in FIG. 1.

FIG. 1 is a schematic cross sectional view of the configuration of a circuit substrate according to one embodiment of the present invention. FIG. 2 is a cross-sectional view along the A-A line direction in FIG. 1.

In the respective drawings, the X-axis, Y-axis, and Z-axis represent three axis directions perpendicular to one another, and the Z-axis direction corresponds to the thickness direction of the circuit substrate.

[Circuit Substrate]

A circuit substrate 100 of the present embodiment includes a first substrate body 10 and a second substrate body 20. The circuit substrate 100 is typically integrally formed with a control substrate 30, but the control substrate 30 may alternatively be formed as a separate component.

(First Substrate Body)

The first substrate body 10 is constituted by a flexible wiring substrate 11 that connects the second substrate body 20 to the control substrate 30, and the first substrate body 10 forms the flexible portion of the circuit substrate 100. The first substrate body 10 typically has the lengthwise direction thereof in the X-axis direction and the widthwise direction in the Y-axis direction, and one edge in the lengthwise direction (first edge 10a) connects to the second substrate body 20 while the other edge (second edge 10b) connects to the control substrate 30.

As shown in FIG. 2, the flexible wiring substrate 11 is constituted by a multilayer member having a resin core 110, wiring layers 111 and 112 on both surfaces thereof, and insulating layers 113 and 114 covering the wiring layers 111 and 112. The resin core 110 is made of a single layer or multiple layers of flexible plastic films such as polyimide or polyethylene terephthalate films, for example. The wiring layers 111 and 112 are typically made of a metal material such as copper or aluminum. Furthermore, the insulating layers 113 and 114 are made of a flexible plastic film having an adhesive layer such as polyimide. A portion of the wiring layers 111 and 112 are connected together by a through hole or via provided in a suitable location in the resin core 110. The wiring layers of the flexible wiring substrate 11 are not limited to two layers and may alternatively one layer or three or more layers.

(Second Substrate Body)

The second substrate body 20 includes a resin substrate 21 containing the first edge 10a of the first substrate body 10, a circuit portion 22 on the resin substrate 21, and a metal reinforcement member 23 embedded in the resin substrate 21.

The resin substrate 21 is constituted by a multilayer member of the flexible wiring substrate 11 that forms the first edge 10a of the first substrate body 10 and resin layers 211 and 212 respectively provided on both surfaces thereof. In other words, the first edge 10a forms the core of the resin substrate 21. The resin substrate 21 forms the exterior of the second substrate body 20 and has a planar shape that is typically rectangular and longer in the X-axis direction, as shown in FIG. 1. The size of the resin substrate 21 has no particular limitations, and is 10-30 mm lengthwise and 10-20 mm widthwise with a thickness of 0.2 to 0.5 mm, for example. The first edge 10a of the first substrate body 10 typically has the same shape and size as the second substrate body 20 but is not limited to this and may alternatively be larger or smaller than the second substrate body 20.

The composite resin material constituting the resin layers 211 and 212 has no particular limitations and is typically an ordinary thermosetting resin material such as an epoxy resin, phenolic resin, BT resin, or the like. These composite resin materials may contain fillers such as glass fibers or oxide particles for conferring a desired mechanical strength.

The circuit portion 22 includes a wiring layer 221 formed on the front surface of the resin substrate 21, a wiring layer 222 formed on the rear surface of the resin substrate 21, and an interlayer connector 223 that connects these wiring layers 221 and 222 together. The wiring layers 221 and 222 electrically connect to the flexible wiring substrate 11 constituting the first substrate body 10.

The wiring layers 221 and 222 are formed on the surface of the resin layers 211 and 212 of the resin substrate 21, and a portion of the wiring layers electrically connect to the reinforcement member 23 through vias formed in suitable locations in the resin layers 211 and 212. The reinforcement member 23 may be a portion of the wiring layer or used as a portion of a grounded wiring line, for example. Furthermore, the reinforcement member 23 may be used as a heat-dissipating component for the electronic components installed on the second substrate body 20.

The circuit portion 22 is typically made of a metal material such as copper or aluminum or a hardened object of metal paste. The circuit portion 22 mainly forms a connection land of the electronic component mounted on the surface of the second substrate body 20, a rewiring layer that electrically connects the electronic component to the flexible wiring substrate 11 of the first substrate body 10, and the like. Insulating protective layers 25 such as solder resists having openings that expose a portion of the surface of the circuit portion 22 are respectively formed at suitable locations on the surface of the circuit portions 22 (wiring layers 221 and 222).

The wiring layers 221 and 222 are not limited to single layer structures and may alternatively be a multilayer structure. Furthermore, it is not necessary to provide both of the wiring layers 221 and 222, and alternatively only one of the wiring layers need be provided.

The reinforcement member 23 confers a desired strength to the second substrate body 20. In the present embodiment, the reinforcement member 23 is made of a plate member that is disposed inside the resin substrate 21. The reinforcement member 23 is made of a good conductor of electricity and heat, typically copper (Cu), but other metal materials such as aluminum may be used instead.

The planar shape of the reinforcement member 23 has no particular limitations, and is a rectangular shape that is a size capable of being housed inside the resin substrate 21, for example. The size of the reinforcement member 23 has no particular limitations, and the length of each side is 5 to 20 mm with a thickness of 0.1 to 0.4 mm, for example.

In particular, as shown in FIG. 1, forming the reinforcement member 23 at a size that can cover approximately the entirety of the resin substrate 21 makes it possible for the reinforcement member 23 to effectively function as the core of the resin substrate 21. Furthermore, the entirety of the reinforcement member 23 being housed inside the resin substrate 21 makes it possible to prevent the reinforcement member 23 from being exposed at the periphery of the resin substrate 21 and to ensure the insulating characteristics of the periphery of the second base substrate 20.

There are no particular limitations to the thickness of the reinforcement member 23, and in the present embodiment the reinforcement member has a similar thickness to the flexible wiring substrate 11 that constitutes the first substrate body 10. Both surfaces of the reinforcement member 23 are covered by the resin layers 211 and 212, and thus the reinforcement member 23 is prevented from being exposed at both surfaces of the second substrate body 20.

In the present embodiment, the reinforcement member 23 is embedded in a housing portion 213 formed in the surface of the resin substrate 21. The housing portion 213 is made of a bottomed or bottomless recess of a size that can house the reinforcement member 23, and in the present embodiment the housing portion is a rectangular opening penetrating through the first edge 10a of the first substrate body 10. The reinforcement member 23 is secured to the inside of the resin substrate 21 via a first insulating material 241 filled into a trench 231 formed so as to penetrate through the surface of the reinforcement member, and via a second insulating material 242 filled into the space between the outer peripheral surface of the reinforcement member 23 and the inner peripheral surface of the housing portion 213

The reinforcement member 23 has one or a plurality of through holes 232 for forming an interlayer connector 223. The through hole 232 is formed in a suitable location in the surface of the reinforcement member 23, such as between the periphery of the reinforcement member 23 and the formation region of the trench 231, for example. The through hole 232 is a round hole of a size that can house the interlayer connector 223. The interlayer connector 223 is typically made of copper plating formed on the inner peripheral surface of the through hole 232 with an insulating layer between the hole and the plating. The insulating layer is constituted by the first insulating material 241, for example.

In the present embodiment, the first insulating material 241 is made of a resin material with a smaller thermal expansion coefficient and higher elasticity than the resin material constituting the resin substrate 21 (resin layers 211 and 212).

The first insulating material 241 is made of a resin material having a smaller thermal expansion coefficient than the resin layers 211 and 212, which makes it possible to ensure adhesion between the housing portion 213 and the reinforcement member 23 and to inhibit warping of the second substrate body 20. Furthermore, the first insulating material 241 being made of a resin material having a higher elasticity than the resin layers 211 and 212 makes it possible to enhance the rigidity of the first resin material layer 241 and to improve the strength of the second substrate body 20.

The material of first insulating material 241 has no particular limitations and may be the same type of material as the resin material that constitutes the resin layers 211 and 212, for example. In such a case, increasing the amount of filler to be higher than the resin layers 211 and 212 makes it possible for the first insulating material 241 to have a smaller thermal coefficient and a higher elasticity than the resin layers 211 and 212.

Meanwhile, the second insulating material 242 is made of a material with a lower elasticity than the resin material constituting the resin substrate 21 (resin layers 211 and 212). This allows bending stress exerted on the periphery of the second substrate body 20 to be alleviated by the second insulating material 242, which makes it possible to prevent the reinforcement member 23 from becoming detached from the housing portion 213. Furthermore, the second insulating material 242 may be made of a material with a lower water absorption than the resin layers 211 and 212. This prevents volume expansion or swelling of the second insulating material 242 caused by the absorption of water.

The material constituting the second insulating material 242 has no particular limitations and is preferably a material that is highly compatible with the first substrate body 10 (flexible wiring substrate 11), examples of which include epoxy, polyimide, liquid crystal polymers, BT resin, PPS, or the like.

As described above, the material is filled in between the outer peripheral surface of the reinforcement member 23 and the inner peripheral surface of the housing portion 213. The second insulating material 242 does not need to be present on the entire outer peripheral surface of the reinforcement member 23, and may instead be provided on at least one edge of the reinforcement member facing the first edge 10a of the first substrate body 10. This makes it possible for tensile stress from the first substrate body 10 to be absorbed or alleviated by the second insulating material 242 and to inhibit damage or detachment of the second substrate body 20, for example.

Furthermore, this aspect is not limited to cases in which the entirety of the one edge between the reinforcement member 23 and housing portion 213 is filled with the second insulating material 242, and as shown in FIG. 2 it is possible to alternatively provide a multilayer member 243 of the first insulating material 241 and second insulating material 242. In such a case, it is possible to provide both a suitable degree of rigidity and a suitable degree of elasticity to the one edge, which makes it possible to enhance connection reliability between the first substrate body 10 and the second substrate body 20.

The second insulating material 242 may be omitted depending on the required characteristics or specifications, and the first insulating material 241 may be filled between the reinforcement member 23 and housing portion 213 instead of the second insulating material. Furthermore, the multilayer member 243 may also be omitted as necessary, and the entirety of the one edge may be filled with the first insulating material 241 or second insulating material 242.

(Control Substrate)

The control substrate 30 corresponds to a main substrate on which integrated circuits such as ICs and peripheral components therefor are mounted, and the control substrate is electrically connected to the second substrate body 20 via the first substrate body 10. The control substrate 30 is typically made of a double-sided substrate with a larger area than the second substrate body 20.

The control substrate 30 is constituted by a multilayer member of the flexible wiring substrate 11 that forms the second edge 10b of the first substrate body 10 and multilayer wiring portions 31 and 32 respectively provided on both surfaces thereof. The multilayer wiring portions 31 and 32 are typically fabricated via the build-up method. The interlayer insulating films constituting the multilayer wiring portions 31 and 32 may be a glass epoxy rigid material, and in such a case the control substrate 30 is a rigid substrate.

In the circuit substrate 100 of the present embodiment configured as described above, the second substrate body 20 has a plate-like reinforcement member 23 embedded in the resin substrate 21, which makes it possible to improve strength with the thickness of the resin body 21. Accordingly, the present embodiment makes it possible to improve the strength of the second substrate body 20 while satisfying the thickness requirements of the second substrate body 20.

<Method of Manufacturing Circuit Substrate>

Next, the method of manufacturing the circuit substrate 100 configured as above will be described.

FIGS. 3A to 3D and FIGS. 4A to 4D are schematic cross-sectional views of primary steps that explain the method of manufacturing the circuit substrate 100.

Figure 3A:
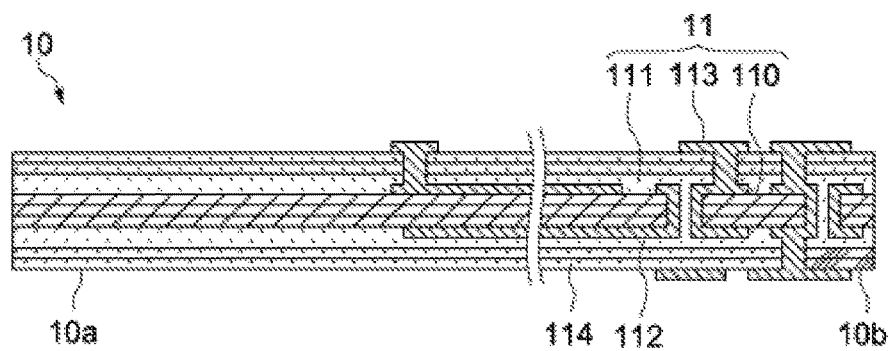
FIGS. 3A to 3D are schematic cross-sectional views for explaining the method of manufacturing the circuit substrate.
Figure 3B:
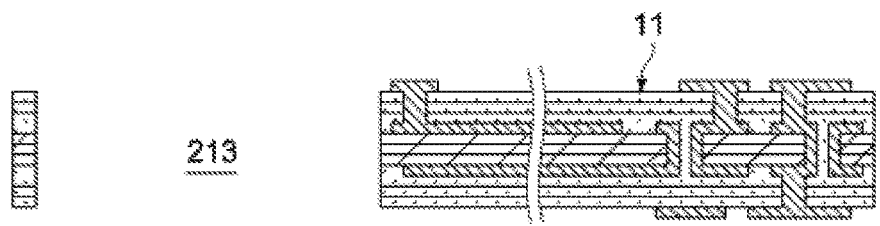

First, as shown in FIGS. 3A and 3B, a housing portion 213 (recess) for housing the reinforcement member 23 is formed in a prescribed region on the first edge 10a side of the flexible wiring substrate 11 that constitutes the first substrate body 10. There are no particular limitations to the method of forming the housing portion 213, and it is possible to use a mechanical process such as punching or cutting or a laser process as appropriate.

Figure 3C:
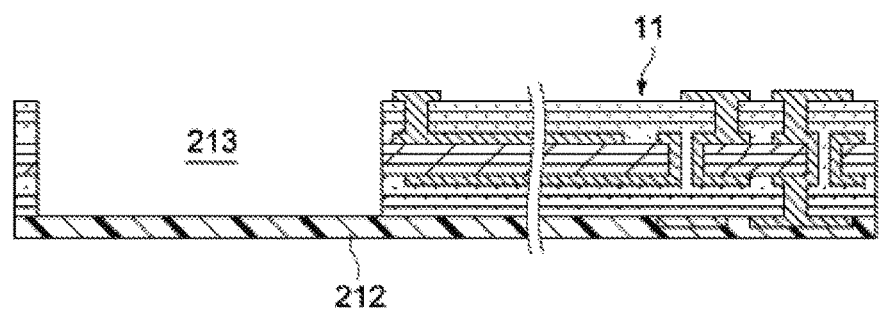

Next, as shown in FIG. 3C, the resin layer 212 that covers the housing portion 213 is formed on one surface (the bottom surface in the drawing) of the flexible wiring substrate 11. There are no particular limitations to the method of forming the resin layer 212 and it is possible to use coating, transcription, lamination, or the like as appropriate.

Figure 3D:
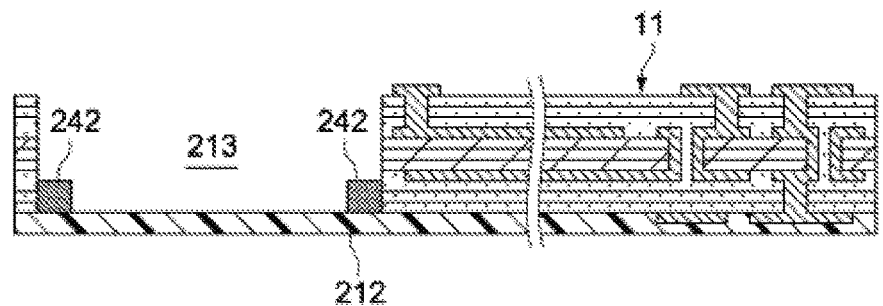
Figure 4A:
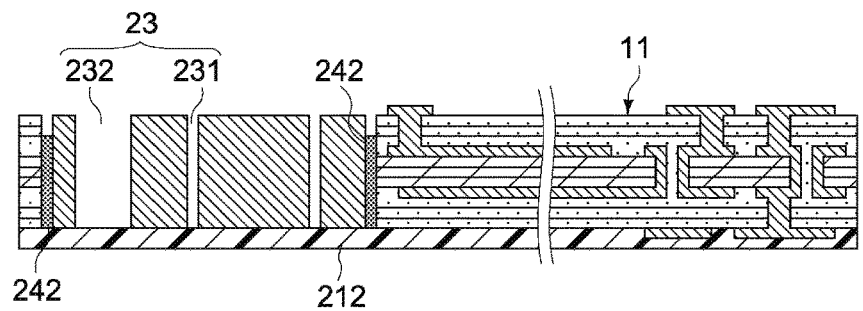
FIGS. 4A to 4D are schematic cross-sectional views for explaining the method of manufacturing the circuit substrate.

Next, as shown in FIG. 3D, the material constituting the second insulating material 242 is coated on the inner peripheral surface of the housing portion 213 on the interface with the resin layer 212. Thereafter, as shown in FIG. 4A, the reinforcement member 23 is disposed on the resin layer 212 inside the housing portion 213, and the second insulating material 242 is filled to a prescribed height between the outer peripheral surface of the reinforcement member 23 and the inner peripheral surface of the housing portion 213. In such a case, a portion of the second insulating material 242 may be interposed between the reinforcement member 23 and the resin layer 212.

Figure 4B:
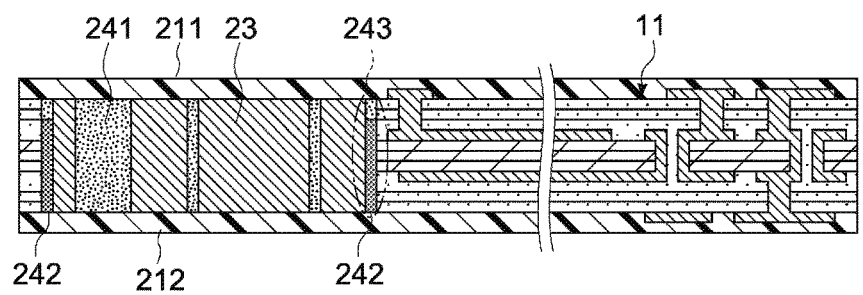

Next, as shown in FIG. 4B, the material constituting the first insulating material 241 is filled in the trench 231 and the through hole 232 in the reinforcement member 23. At this time, providing the first insulating material 241 between the outer peripheral surface of the reinforcement member 23 and the gap between the inner peripheral surface of the housing portion 213 and the second insulating material 242 forms the multilayer member 243, which is made of a multilayer structure of the first and second insulating materials 241 and 242.

Thereafter, the resin layer 211 that covers the reinforcement member 23 is formed on the other surface (top surface in the drawing) of the flexible wiring substrate 11 (FIG. 4B). There are no particular limitations to the method of forming the resin layer 211, and it is possible to use a method similar to the method of forming the resin layer 212.

Figure 4C:
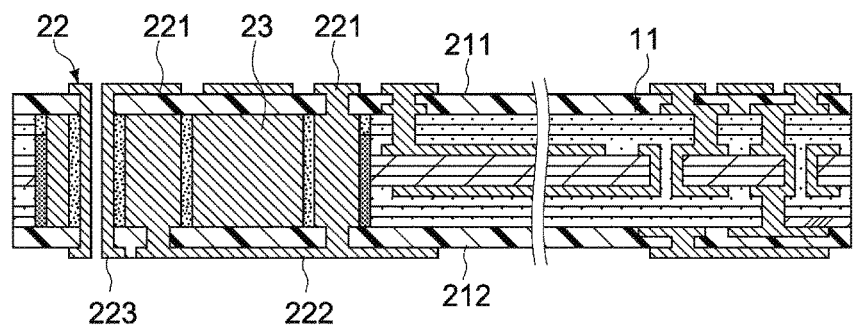

Next, as shown in FIG. 4C, the circuit portion 22 containing the wiring layers 221 & 222 and the interlayer connector 223 is formed on the surface of the resin layers 211 and 212. The wiring layers 221 and 222 can be formed by appropriate patterning via a plating or etching method, and a portion of the wiring layers connects to the reinforcement member 23 by the vias in the resin layers 211 and 212. The interlayer connector 223 is formed by forming a through hole in the first insulating material 241 filled into the through hole 232 in the reinforcement member 23, using plating to grow the conductive layer on the inner wall surface of the interlayer connector, and filling in a conductive paste.

Figure 4D:
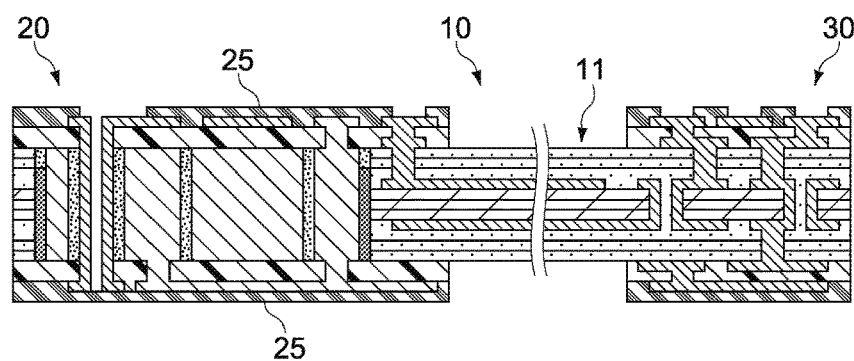

Next, as shown in FIG. 4D, the insulating protective layers 25 that partially cover the circuit portion 22 on the resin layers 211 and 212 are respectively formed, and the resin layers 211 and 212 inside the forming area of the flexible portion 10 are partially removed. This fabricates the circuit substrate 100 including the first substrate body 10, second substrate body 20, and control substrate 30.

Embodiment 2

Figure 5:
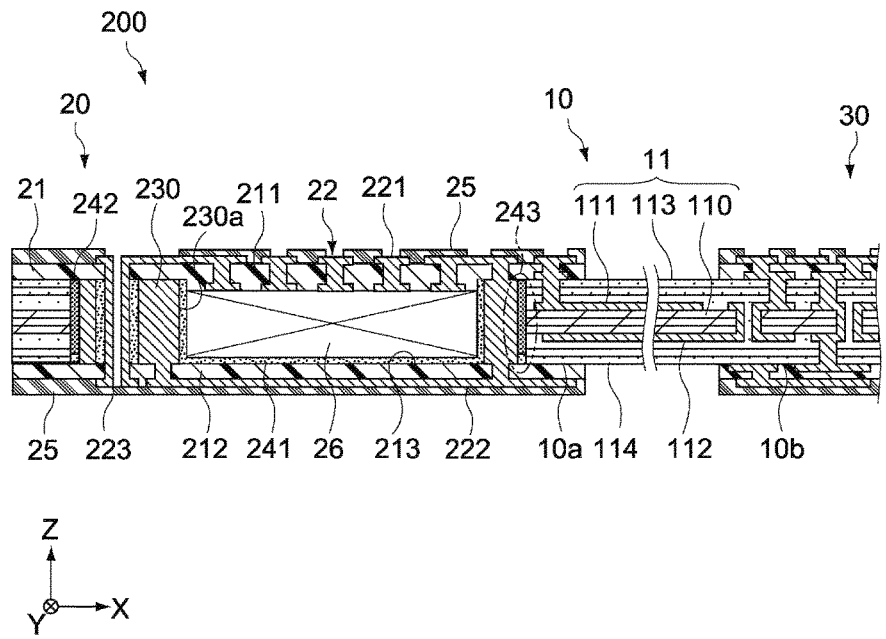
FIG. 5 is a schematic cross sectional view of the configuration of a circuit substrate according to another embodiment of the present invention.

FIG. 5 is a schematic cross sectional view of the configuration of a circuit substrate 200 according to another embodiment of the present invention. The configurations differing from Embodiment 1 will mainly be described below, and the same reference characters will be given to the components that are the same as Embodiment 1 described above; thus, repetitive explanations will be omitted or simplified.

The circuit substrate 200 of the present embodiment is similar to Embodiment 1 in having the first substrate body 10 and second substrate body 20, but differs from Embodiment 1 in having an electronic component 26 embedded in the second substrate body 20.

In the present embodiment, the second substrate body 20 includes a resin substrate 21 containing the first edge 10a of the first substrate body 10, a circuit portion 22 on the resin substrate 21, a reinforcement member 230 embedded in the resin substrate 21, and an electronic component 26 housed inside the reinforcement member 230.

The reinforcement member 230 is made of a rectangular frame that has a cavity 230a, and similar to Embodiment 1 the reinforcement member is housed in a housing portion 213 of the resin substrate 21. The electronic component 26 is disposed inside the cavity 230a in the reinforcement member 230. There are no particular limitations to the type of electronic component 26, and the component may be a semiconductor chip such as an IC, or various types of sensor components including a solid-state image sensing device, acceleration sensor, or the like. The electronic component 26 electrically connects to the circuit portion 22 (wiring layer 221) through a via disposed in an appropriate location in the resin layer 211.

The space between the electronic component 26 and the inner peripheral surface of the reinforcement member 230 and the space between the electronic component 26 and the resin layer 212 is filled with a material for forming the first insulating material 241. This material allows the first insulating material 241 to have a lower thermal expansion coefficient and a higher elasticity than the resin layers 221 and 222, and thus makes it possible to prevent electrical short-circuiting between the electronic component 26 and the reinforcement member 230 while integrally holding the electronic component 26 to the reinforcement member 230.

Furthermore, in a similar manner to Embodiment 1, a multilayer member 243 constituted by a multilayer structure of the first and second insulating materials 241 and 242 is provided between the outer peripheral surface of the reinforcement member 230 and the inner peripheral surface of the housing portion 213. The present embodiment differs from Embodiment 1 in that the second insulating material 242 is on the resin layer 211 side, but this is due to the sealing process of the electronic component 26 by the first insulating material 241 and thus is not a defining characteristic of this configuration, and the second insulating material 244 may alternatively be positioned on the resin layer 212 side, in a similar manner to Embodiment 1.

In the circuit substrate 200 of the present embodiment as configured above, it is possible to improve the strength of the second substrate body 20 while satisfying the thickness requirements of the second substrate body 20, in a similar manner to Embodiment 1 above. In particular, the present embodiment makes it possible to perform three-dimensional mounting of components in the second substrate body 20 due to the electronic component 26 being embedded inside the second substrate body 20.

Furthermore, the electronic component 26 embedded in the second substrate body 20 is surrounded by the high-rigidity reinforcement member 230, which makes it possible to reliably protect the electronic component 26 from deformation or warping caused by external stress, temperature change, etc. affecting the second substrate body 20. Moreover, the improvement in bending strength of the second substrate body 20 conferred by the rigidity of the reinforcement member 230 can ensure the desired operating characteristics of the electronic component 26.

Embodiment 3

Figure 6:
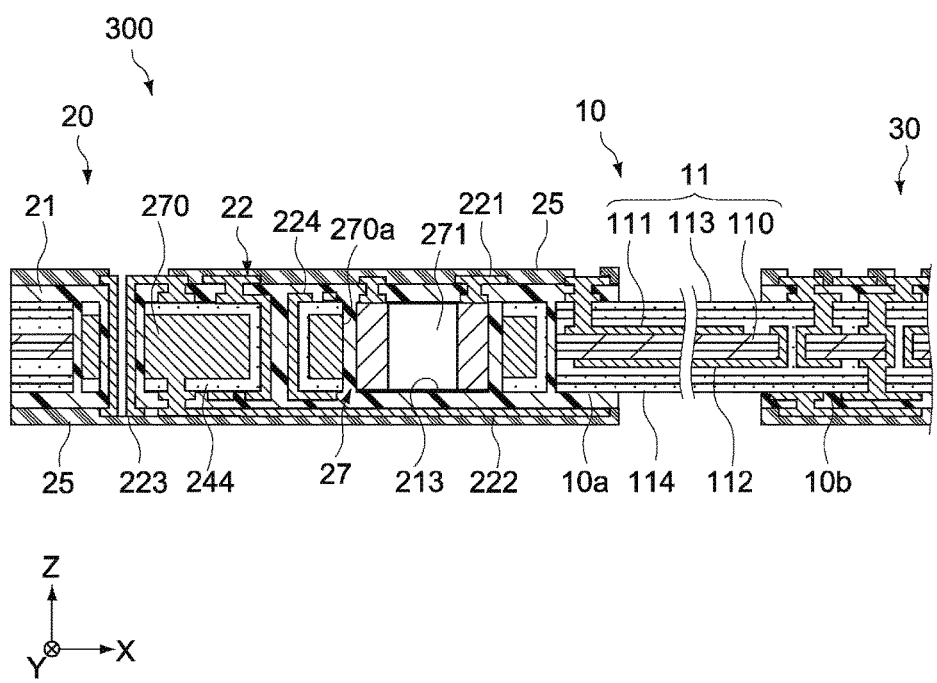
FIG. 6 is a schematic cross sectional view of the configuration of a circuit substrate according to yet another embodiment of the present invention.
Figure 7A:
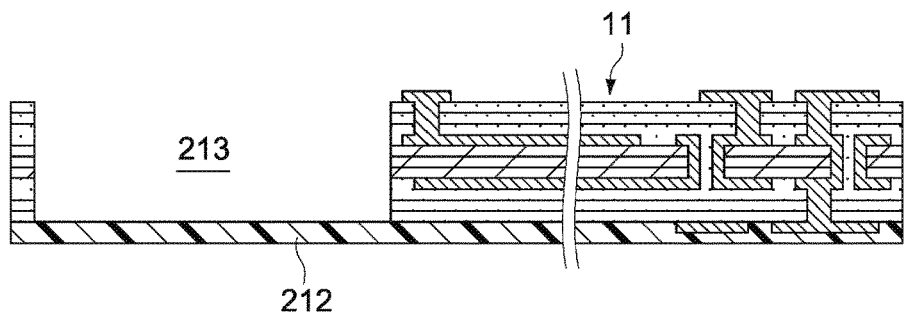
FIGS. 7A to 7D are schematic cross-sectional views for explaining a modification example of the method of manufacturing the circuit substrate.
Figure 7B:
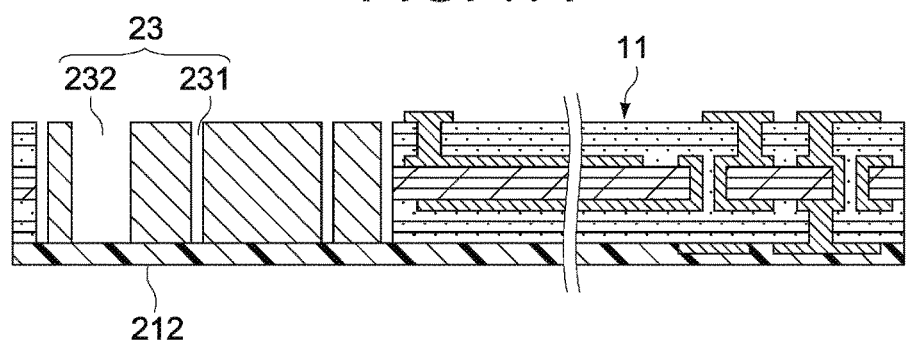
Figure 7C:
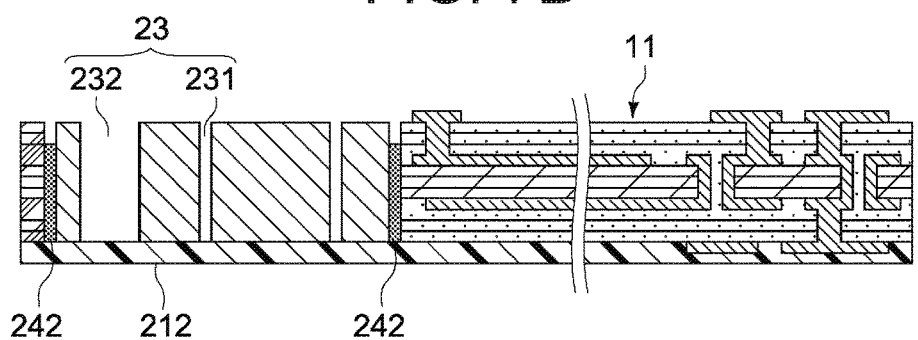
Figure 7D:
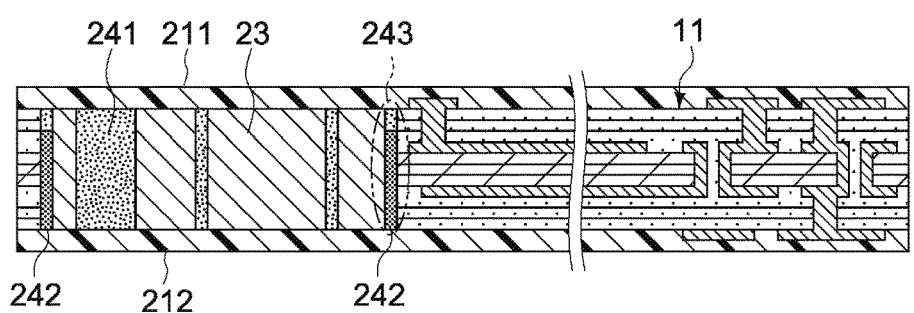

FIG. 6 is a schematic cross sectional view of the configuration of a circuit substrate 300 according to another embodiment of the present invention. The configurations differing from Embodiment 1 will mainly be described below, and the same reference characters will be given to the components that are the same as Embodiment 1 described above; thus, repetitive explanations will be omitted or simplified.

The circuit substrate 300 of the present embodiment is similar to Embodiment 1 in having the first substrate body 10 and second substrate body 20, but differs from Embodiment 1 in having a multilayer substrate 27 with the reinforcement member 30 as a core embedded in the second substrate body 20.

In the present embodiment, the second substrate body 20 includes a resin substrate 21 containing the first edge 10a of the first substrate body 10, a circuit portion 22 on the resin substrate 21, and the multilayer substrate 27 embedded in the resin substrate 21. The multilayer substrate 27 includes a reinforcement member 270 as the core material and an electronic component 271.

The reinforcement member 270 is made of a rectangular plate that has a cavity 270a and through hole for forming a via, and similar to Embodiment 1 the reinforcement member is housed in a housing portion 213 of the resin substrate 21. The electronic component 271 is disposed in the cavity 270a. There are no particular limitations to the type of electronic component 271 and typically a chip component such as a capacitor, inductor, resistor, etc. is used, but it is also possible to use a semiconductor chip such as an IC, various types of sensor components, or the like.

Both surfaces of the reinforcement member 270 are covered by an insulating layer 244, and a wiring layer 224 respectively electrically connecting to the electronic component 271 and circuit portion 22 (wiring layers 221 and 222) is provided on the insulating layer 244. The wiring layer 224 is made of a metal film such as copper patterned into a prescribed shape, and the wiring layer forms an interlayer connector that connects respective surfaces together via the through hole in the reinforcement member 270.

In the circuit substrate 300 of the present embodiment as configured above, it is possible to improve the strength of the second substrate body 20 while satisfying the thickness requirements of the second substrate body 20, in a similar manner to Embodiment 1 above. In particular, the present embodiment makes it possible to have higher functionality and higher density mounting for the second substrate body 20 due to multilayer substrate 27 embedded inside the second substrate body 20.

Furthermore, the electronic component 271 embedded in the second substrate body 20 is surrounded by the high-rigidity reinforcement member 270, which makes it possible to reliably protect the electronic component 271 from deformation or warping caused by external stress, temperature change, etc. affecting the second substrate body 20. Moreover, the improvement in bending strength of the second substrate body 20 conferred by the rigidity of the reinforcement member 270 can ensure the desired operating characteristics of the electronic component 271.

The multilayer substrate 27 does not necessarily need to embed the electronic component 271 and may alternatively be constituted by only the reinforcement member 270, insulating layer 244, and wiring layer 224. The multilayer substrate 27 is not limited to both substrates shown and may alternatively be a multilayer substrate having three or more layers with an internal wiring layer.

Embodiments of the present invention were described above, but the present invention is not limited to the above-mentioned embodiments, and various modifications can be made.

For example, in the embodiments described above, the plan view shape of the second substrate body 20 and reinforcement members 23 and 230 was rectangular, but the shape is not limited to this and may alternatively be a polygonal shape, a circular shape, or other geometrical shape. Furthermore, the reinforcement member is not limited to a single plate or frame, and may be a plurality of plates or frames. Moreover, the frame is not limited to being frame-shaped and can be grid-shaped, mesh-shaped, or another form.

In the embodiments described above, the control substrate 30 was disposed on the second edge 10b of the first substrate body 10, but alternatively a contact component such as a connector may be provided instead.

In Embodiment 1 described above, before the reinforcement member 23 is disposed in the housing portion 213, the material constituting the second insulating material 242 is coated onto a prescribed location of the housing portion 213 (see FIG. 3D), but the present invention is not limited to this. For example, as shown in FIGS. 7A to 7D, after the reinforcement member 23 is disposed in the housing portion 213, the material constituting the second insulating material 242 can be filled into the gaps between the inner peripheral surface of the housing portion 213 and the outer peripheral surface of the reinforcement member 23.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A circuit substrate, comprising:
a first substrate body made of a flexible wiring substrate and having a first edge and a second edge opposite to the first edge, the first substrate body having a bottomed or bottomless recess adjacent to the first edge;
a plate-shaped or frame-shaped reinforcement member disposed in said recess of the first substrate body adjacent to the first edge;
a pair of resin layers sandwiching the reinforcement member in said recess and a portion of the first substrate body adjacent to the reinforcement member including the first edge, each of the resin layers having a circuit portion formed thereon electrically connected to the flexible wiring substrate.

2. The circuit substrate according to claim 1,
wherein a planar shape of the first substrate body surrounds said recess and is generally rectangular, and
wherein the reinforcement member is made of a rectangular plate that has a vertical trench or cavity therein.

3. The circuit substrate according to claim 2, wherein said recess of the first substrate body includes an electronic component embedded therein sandwiched by said pair of resin layers.

4. The circuit substrate according to claim 3, further comprising a first insulating material filled into the vertical trench or cavity of the reinforcement member,
wherein the first insulating material has a lower thermal expansion coefficient and higher elasticity than a resin material forming the resin layers.

5. The circuit substrate according to claim 4, further comprising a second insulating material inside said recess between the reinforcement member and a sidewall of said recess at least on a side opposite to the first edge, and
wherein the second insulating material is made of a material having a lower elasticity than the resin material forming the resin layers.

6. The circuit substrate according to claim 5, wherein the first insulating material and the second insulating material are both disposed relatively on said side opposite to the first edge in said recess of the first substrate body.

7. The circuit substrate according to claim 3, further comprising an insulating layer on at least one surface of the reinforcement member, and a wiring layer on the insulating layer, the wiring layer being electrically connected to the electronic component and the circuit portion.

8. The circuit substrate according to claim 1, further comprising a control substrate physically and electrically connected to the second edge of the flexible wiring substrate.

9. The circuit substrate according to claim 1, further comprising an insulating layer on at least one surface of the reinforcement member, and a wiring layer on the insulating layer, the wiring layer being electrically connected to the circuit portion,
wherein said recess of the first substrate body does not include an electronic component therein.

10. The circuit substrate according to claim 1, wherein the plate-shaped or frame-shaped reinforcement member is made of metal.

11. A method of manufacturing a circuit substrate, comprising:
preparing a first substrate body made of a flexible wiring substrate and having a first edge and a second edge opposite to the first edge;
forming a bottomed or bottomless recess in the first substrate body adjacent to the first edge;
placing a plate-shaped or frame-shaped reinforcement member in the recess of the first substrate body adjacent to the first edge;
forming a pair of resin layers sandwiching the reinforcement member in said recess and a portion of the first substrate body adjacent to the reinforcement member including the first edge; and
forming a circuit portion on each of the resin layers that electrically connects to the flexible wiring substrate.

12. The method according to claim 11, wherein the plate-shaped or frame-shaped reinforcement member is made of metal.

* * * * *